(12) United States Patent
Porst

(10) Patent No.: US 11,519,961 B2
(45) Date of Patent: Dec. 6, 2022

(54) EXTENDED JTAG CONTROLLER AND METHOD FOR FUNCTIONAL DEBUGGING USING THE EXTENDED JTAG CONTROLLER

(71) Applicant: COMMSOLID GMBH, Dresden (DE)

(72) Inventor: Uwe Porst, Dresden (DE)

(73) Assignee: COMMSOLID GMBH, Dresden (DE)

(*) Notice: Subject to any disclaimer, the term of this patent is extended or adjusted under 35 U.S.C. 154(b) by 0 days.

(21) Appl. No.: 17/269,009

(22) PCT Filed: Aug. 22, 2018

(86) PCT No.: PCT/EP2018/072645
§ 371 (c)(1),
(2) Date: Feb. 17, 2021

(87) PCT Pub. No.: WO2020/038571
PCT Pub. Date: Feb. 27, 2020

(65) Prior Publication Data
US 2022/0120809 A1  Apr. 21, 2022

(51) Int. Cl.
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31705* (2013.01); *G01R 31/31721* (2013.01);
(Continued)

(58) Field of Classification Search
CPC .......... G01R 31/3177; G01R 31/31705; G01R 31/318533; G01R 31/318536;
(Continued)

(56) References Cited

U.S. PATENT DOCUMENTS 5,574,733 A * 11/1996 Kim ............... G01R 31/318547
714/739
6,266,793 B1  7/2001 Mozdzen et al.
(Continued)

FOREIGN PATENT DOCUMENTS

KR   20130046615 A   5/2013

OTHER PUBLICATIONS

Leon van de Logt, An extension to JTAG for at-speed debug on a system, 2003, IEEE, pp. 123-130 (Year: 2003).*
(Continued)

*Primary Examiner* — John J Tabone, Jr.
(74) *Attorney, Agent, or Firm* — Heslin Rothenberg Farley & Mesiti P.C.; Kevin P. Radigan, Esq.

(57) ABSTRACT

The invention discloses an extended joint test action group based controller and a method for functional debugging using the extended joint test action group based controller. The object of the invention to lower the power dissipation (dynamic and leakage) but providing the same functionality of the testing and debugging procedures at the same time will be solved by an extended joint test action group (JTAG) controller for testing flip-flops of a register of an integrated circuit (IC) using a design for testing scan infrastructure on the IC which comprises at least one scan chain, wherein an external debugger is connected to the design for testing scan infrastructure via the JTAG controller which is extended by a debug controller, whereas a feedback loop is formed from an output of the scan chain to an input multiplexer of the scan chain which is activated according to the extended JTAG controller.

20 Claims, 3 Drawing Sheets

(52) U.S. Cl.
CPC ............... *G01R 31/31724* (2013.01); *G01R 31/318533* (2013.01); *G01R 31/318536* (2013.01); *G01R 31/318555* (2013.01); *G01R 31/318597* (2013.01)

(58) Field of Classification Search
CPC ...... G01R 31/318597; G01R 31/31721; G01R 31/31724; G01R 31/318555
USPC ............................... 714/729, 726, 727, 733
See application file for complete search history.

(56) References Cited

U.S. PATENT DOCUMENTS

| | | | | |
|---|---|---|---|---|
| 6,662,327 | B1* | 12/2003 | Rajski | G01R 31/31813 714/739 |
| 7,644,333 | B2* | 1/2010 | Hill | G01R 31/318547 714/732 |
| 7,788,558 | B2* | 8/2010 | Shimooka | G01R 31/318536 714/726 |
| 8,933,447 | B1* | 1/2015 | Rahman | G01R 31/318513 257/797 |
| 2002/0073373 | A1* | 6/2002 | Nakao | G11C 29/10 714/728 |
| 2002/0138801 | A1* | 9/2002 | Wang | G01R 31/31705 714/729 |
| 2003/0115525 | A1* | 6/2003 | Hill | G01R 31/318547 714/726 |
| 2006/0156099 | A1* | 7/2006 | Sweet | G01R 31/31705 714/724 |
| 2007/0011525 | A1* | 1/2007 | Suzuki | G01R 31/318536 714/726 |
| 2008/0092002 | A1* | 4/2008 | Shimooka | G01R 31/318536 714/E11.155 |
| 2009/0158105 | A1* | 6/2009 | Konda | G06F 11/267 714/E11.159 |
| 2011/0148445 | A1* | 6/2011 | Zivkovic | G01R 31/318508 324/750.3 |
| 2014/0082421 | A1* | 3/2014 | Marinissen | G01R 31/318575 714/34 |
| 2016/0349320 | A1* | 12/2016 | Laisne | G01R 31/31724 |
| 2017/0097388 | A1* | 4/2017 | Parasrampuria | G01R 31/318547 |
| 2018/0340977 | A1* | 11/2018 | Chakraborty | G01R 31/31727 |
| 2019/0018731 | A1* | 1/2019 | Schat | G01R 31/3181 |

OTHER PUBLICATIONS

International Search Report and Written Opinion issued in PCT/EP2018/072645 dated May 7, 2019.

Guo Jian-Min et al., "A functional enhancement methodology to JTAG controller in complex SOC", Computer Science & Education, Jul. 25, 2009, ICCSE, 4th International Conference on IEEE, pp. 1128-1131, Piscataway, N.J., USA.

* cited by examiner

EXTENDED JTAG CONTROLLER AND METHOD FOR FUNCTIONAL DEBUGGING USING THE EXTENDED JTAG CONTROLLER

CROSS REFERENCE TO RELATED APPLICATIONS

This application is the National Phase filing under 35 U.S.C. § 371 of International Application No.: PCT/EP2018/072645, filed on Aug. 22, 2018. The contents of this prior application is hereby incorporated by reference herein in its entirety.

BACKGROUND ART

The invention discloses an extended joint test action group based controller and a method using the extended joint test action group based controller for a functional debugging.

Figure 1:
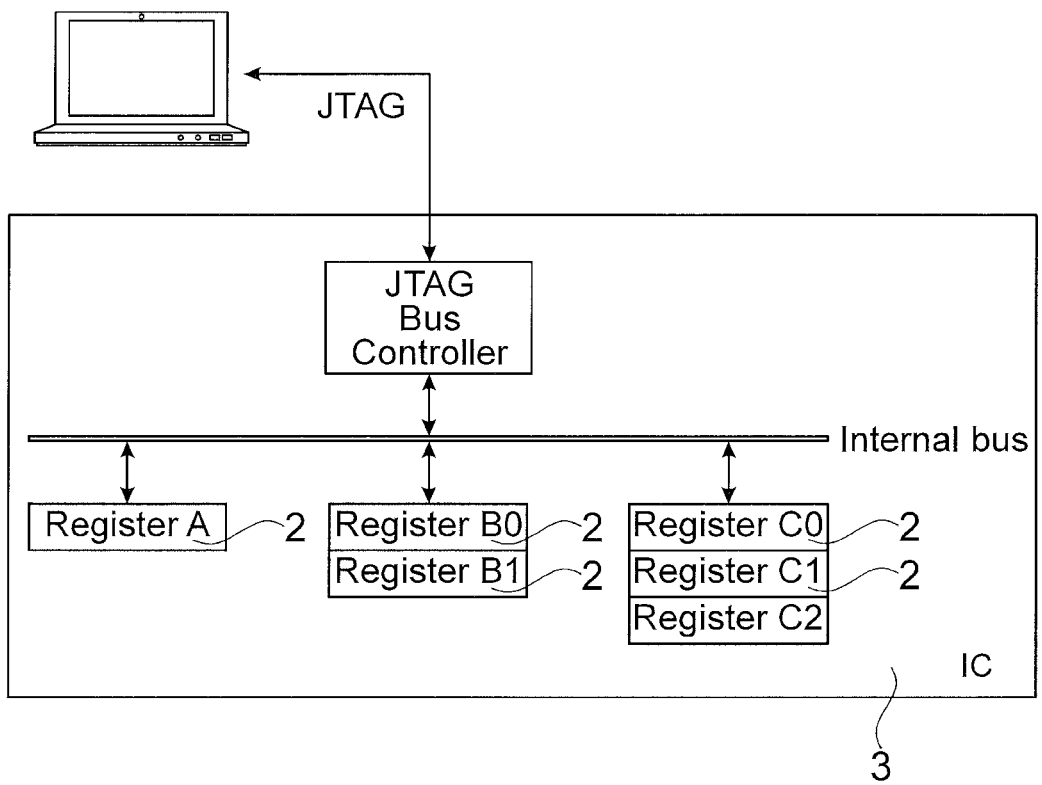

Modern digital integrated circuits consists of a joint test action group (JTAG) based infrastructure for functional debug, i.e. all registers can be read and written which are connected to the internal bus of the IC. FIG. 1 illustrates how an external debugger is connected via the JTAG controller to the internal registers. The disadvantage is that not all registers can be read or written on this way, such as e.g. internal state machine registers. Another disadvantage is, if the bus is blocked or in a dead lock stage, no registers can be read or written anyway.

Each integrated circuit (IC) requires design for test (DfT) structures for production test to ensure the full functionality of the produced IC. Hence, the design for testing comprises IC design techniques that add testability features to a hardware product design. The added features make it easier to develop and apply manufacturing tests to the designed hardware. The purpose of manufacturing tests is to validate that the product hardware contains no manufacturing defects that could adversely affect the product's correct functioning. Tests can be applied at several steps in the hardware manufacturing flow and may also be used for hardware maintenance in the customer's environment. The tests are generally driven by test programs for finding and indicating the presence of defects (i.e. the test fails), tests may be able to log diagnostic information about the nature of the encountered test fails. The diagnostic information can be used to locate the source of the failure. In other words, the response of vectors (patterns) from a good circuit is compared with the response of vectors (using the same patterns) from a device under test (DUT). If the response is the same or matches, the circuit is good. Otherwise, the circuit is not manufactured as it was intended.

Figure 2:
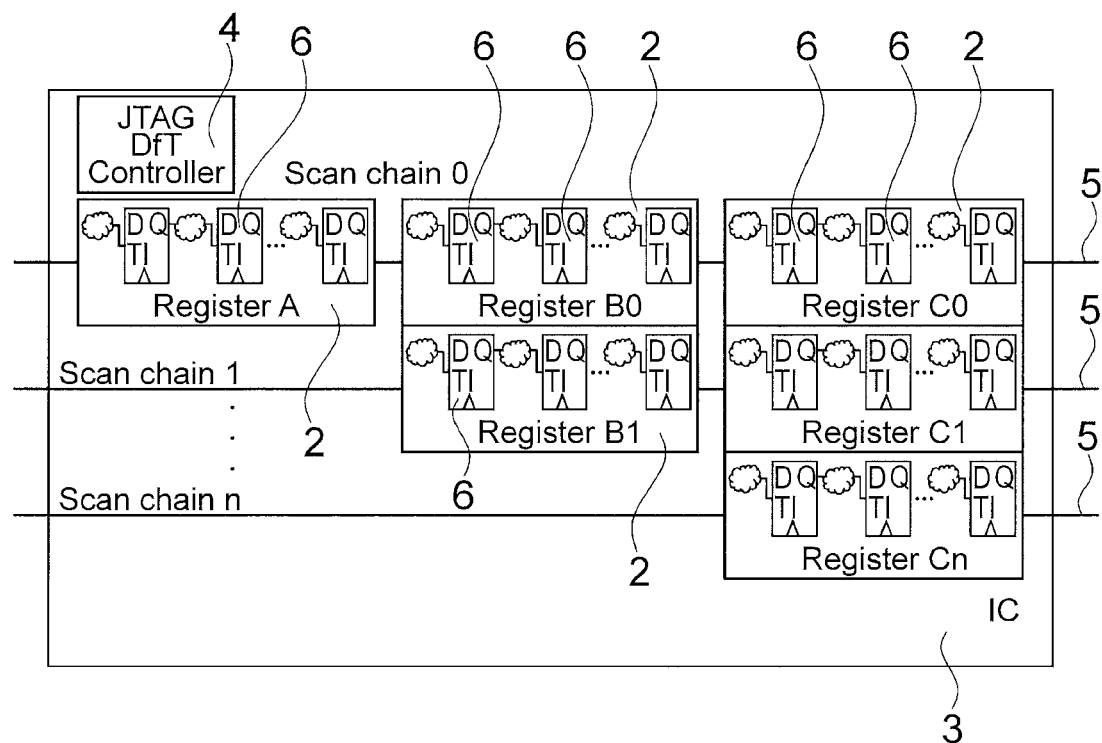

One part of the design for test is a scan-test, another part is BIST—a build in self-test for memory and/or logic. In scan-test a briefed connection between each flip-flop of the subcomponents of the IC is tested. FIG. 2 shows such a structure. In the scan-test, registers (flip-flops or latches) in the design are connected in one or more scan chains, which are used to gain access to internal nodes of the IC. A scan chain or a scan structure is a technique used in design for testing. Test patterns are shifted in via the scan chain(s), functional clock signals are pulsed to test the circuit during the "capture cycle(s)", and the results are then shifted out to chip output pins and compared against the expected "good machine" results. In addition to being useful for manufacturing "go/no go" testing, scan chains can also be used to "debug" chip designs. In this context, the chip is exercised in normal "functional mode" (for example a computer or mobile-phone chip might execute assembly language instructions). At any time, the chip clock can be stopped, and the chip re-configured into "test mode". At this point the full internal state can be dumped out, or set to any desired values, by use of the scan chains. Another use of scan to aid debug consists of scanning in an initial state to all memory elements and then go back to functional mode to perform system debug. The advantage is to bring the system to a known state without going through many clock cycles. So, a common design for test structures provides several scan chains that consists of serial connected registers of an IC. Thus, the JTAG based design for test controller is the master of the design for test procedure.

The challenge of this invention is to make all registers visible for the external debugger, which are not connected to the internal bus. It must be also guaranteed that all registers can be read or written. On the other hand low power devices which are supplied by battery require very low power consumption. That means the IC should have the lowest possible gate count, because less gate count means less power dissipation. The additional hardware to fulfil the functional debugging requirement should have as less as possible gates in order to not increase the static and dynamic power dissipation.

It is therefore the object of the invention to lower the power dissipation (dynamic and leakage) but providing the same functionality of the testing and debugging procedures at the same time.

SUMMARY OF THE INVENTION

The object of the invention will be solved by an extended joint test action group (JTAG) controller for testing flip-flops of a register of an integrated circuit (IC) using a design for testing (DfT) scan infrastructure on the IC, which comprises at least one scan chain. An external debugger is connected to the design for testing (DfT) scan infrastructure via the JTAG controller, which is extended by a debug controller, where a feedback loop is formed from an output of the scan chain to an input multiplexer of the scan chain and a selected scan chain is activated according to the extended JTAG controller in order to directly test its functionality. A scan chain is formed by registers which comprise flip-flops.

By merging the design for testing infrastructure with the debugging infrastructure one can save gates of the IC and make all registers of the IC accessible to the external debugger and lower the power dissipation. All internal registers are accessible to the external debugger because it is not necessary any longer to access the registers over the internal bus. Therefore, the problems of no read and write possibility to the internal registers of the IC if the internal bus is blocked or in a dead lock stage does not exist any longer.

In an embodiment of the invention all scan chains have a same number of flip-flops. This has the advantage that the change to the next scan chain can be controlled by the number of shift clock pulses which is the same for all scan chains. While the states of flip-flops in a selected scan chain is transmitted to the extended JTAG controller with the inserted debug controller the states of the flip-flops in the other scan chains are fed back to the input multiplexer of these scan chains respectively. Therefore, these states will be conserved and can be debugged if the scan chain will be selected and activated by the extended JTAG controller.

In another embodiment of the invention a dummy flip-flop is inserted in a scan chain, if the number of flip-flops in that scan chain is different to the other scan chains. This is necessary to balance the number of flip-flops per scan. If the number of flip-flops is not balanced meaning if a chain has less flip-flops, dummy flip-flops needs to be inserted to fulfil the requirement. If the flip-flop number is not balanced, the invention would not work.

In a further embodiment of the invention the output of the scan chains are connected to an output multiplexer transmitting the outputs of the scan chains to the extended JTAG controller. This is used to feed in the flip-flop content of the selected scan chain to the JTAG controller.

In another embodiment of the invention the external debugger observes the flip-flops states of the IC and replaces the flip-flop states via the extended JTAG controller. The output of a scan chain will be observed by the JTAG controller and the external debugger. In debugging mode the observed states of the flip-flops or flip-flops states can be replaced by new values. This has the advantage that read/modify operations from the debugger are supported.

In a further preferred embodiment the extended JTAG controller comprises an event trigger. In the sense of the invention an event is a cycle counter/timer in the JTAG controller. If the programmed cycle-counter value/timer value is reached, an event is generated. If the event occurs, the JTAG controller switches into the design for testing mode and stops all clocks, which means that the system is stopped. Now the system can be debugged. It is also possible, if such an event occurs, that the extended JTAG controller shifts out all register states to an external or internal memory.

In a further embodiment of the inventive extended JTAG controller the last flip-flop of a specified scan chain is designed as a hardware breakpoint. This scan chain is specified in the design process of the JTAG controller. For this purpose, the output multiplexer of the scan chains is set so that this last flip-flop of the specified scan chain is switched to the JTAG controller. In principle, one can use all the last flip-flops of the chains as an event. Therefore an additional register in the JTAG controller is needed that defines the polarity of the event. A hardware breakpoint is used as an event as defined above.

In summary, the JTAG controller is extended by the two additional features: A cycle-counter/timer to keep the IC running autonomously for a certain amount of time/clocks. This allows a better debugging and is faster than programming each clock-cycle for each scan chain individually. Secondly, the hardware breakpoint is the last register of a scan chain. The corresponding register is defined via the output multiplexer. This requires an additional register in the JTAG controller, which defines the polarity of the event, i.e. if the register high or low is active.

These extensions would have to be defined in the JTAG controller (OP codes) and have to be implemented.

The object of the invention will also be solved by a method for functional debugging of registers of an IC using the inventive extended joint action group (JTAG) controller, wherein in debugging mode
- a selected scan chain is connected to the JTAG controller,
- the selected scan chain is observed by the JTAG controller,
- the JTAG controller controls an output multiplexer multiplexing outputs of connected scan chains and the according input multiplexer of the selected scan chain, whereas
- the JTAG controller controls the number of shift clock cycles, and the selected scan chain can be modified by the JTAG controller, whereas the selected scan chain is fed back from the JTAG controller to the input multiplexer of the selected scan chain,
while setting all other scan chains of the IC in a loop back mode.

In an embodiment of the inventive method the flip-flops of the scan chains that are not observed by the external debugger are fed back and hence are in a loop back mode. This makes the hardware design less complex of the extended JTAG controller. The extended JTAG controller generates the number of clock pulses for all scan chains. If the loop back is not in, the device state will be destroyed, because the content of the not selected chains are lost, or the controlling hardware for the clocks of the remaining chains is more complex, i.e. each scan chain needs its own clock pulse generator.

In another embodiment of the inventive method the JTAG controller switches to the next scan chain if an external debugger is accessing the said scan chain. The extended JTAG controller can be switched to another scan chain, if the external debugger is accessing it. The external debugger has the control, which scan chain is selected. In general, the debugger can read out all scan chains. The idea is to get the contents of all the flip-flops, which makes it possible to have the complete design state in a debugger, which is really helpful in a debugging event. The debugger can read each scan chain by switching from one scan chain to another and shifting the content. This of course costs time, but if the debugger is smart enough, only the necessary scan chains are read out.

In a further embodiment of the inventive method if the extended JTAG controller is in design of testing mode the JTAG controller controls the input multiplexer, whereas a default value is routed through the scan chains. The input multiplexer of a scan chain has three inputs, a first one for design for test, a second one for the loop back, and a third one for observer/setting register content. When the JTAG controller is in functional mode, the input multiplexer of a scan chain is set to loop back. The JTAG controller controls this input multiplexer in testing mode as well as in functional mode. Default setting of the input multiplexer is design for test. The JTAG controller can set the input multiplexer in functional mode for loop back mode as well as to observe/setting register content mode.

The invention will be explained in more detail using exemplary embodiments.

BRIEF DESCRIPTION OF THE DRAWING FIGURES

Figure 3:
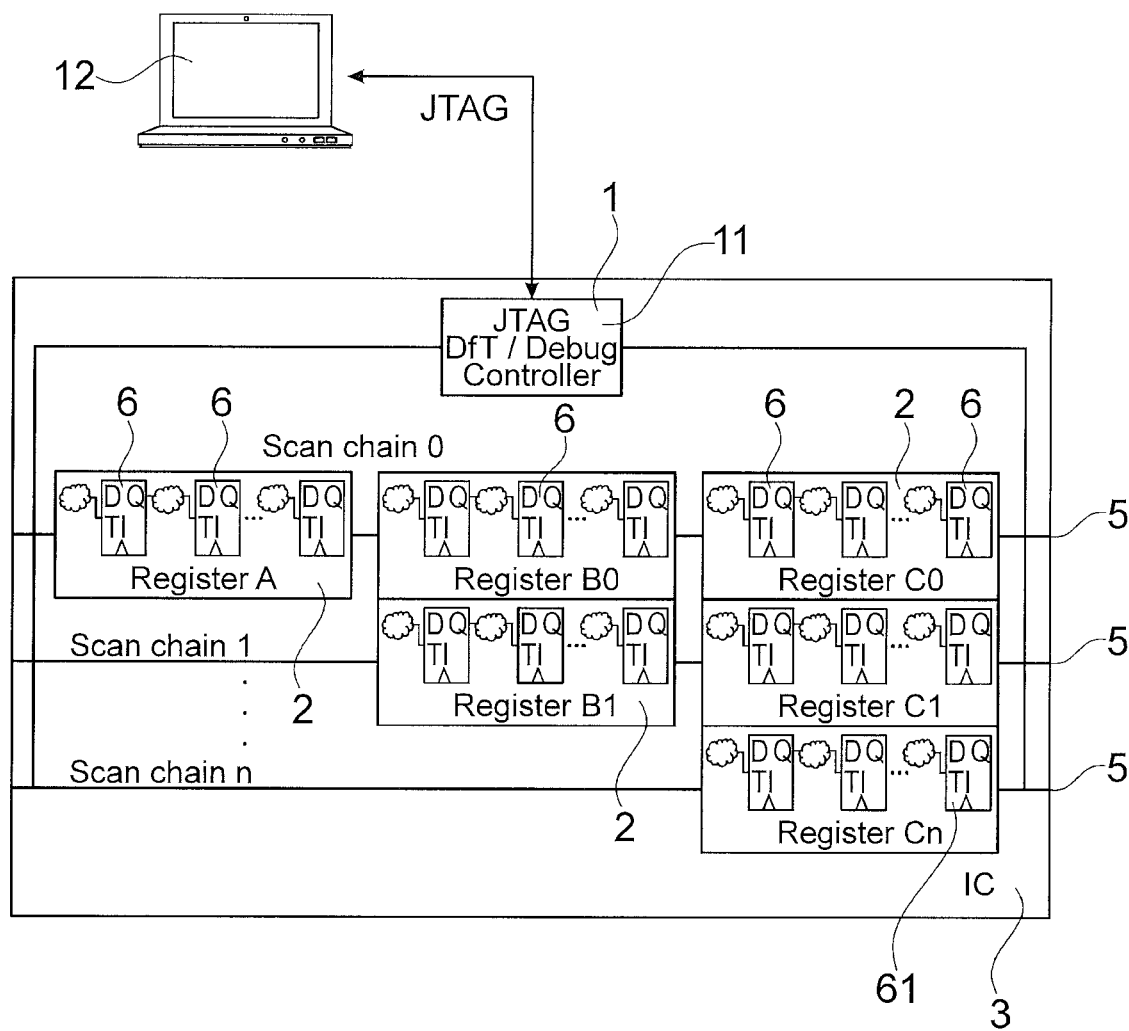
Figure 4:
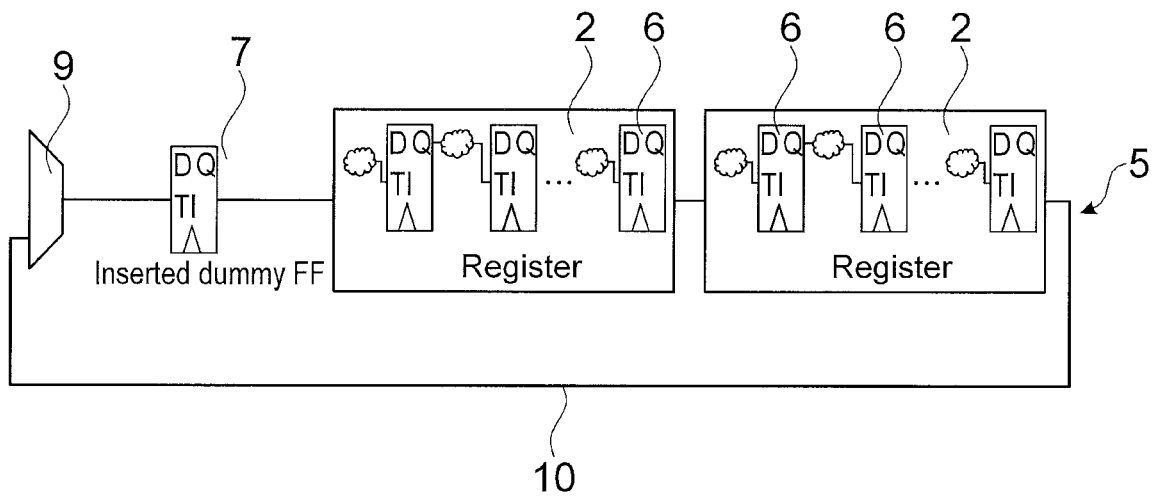
Figure 5:
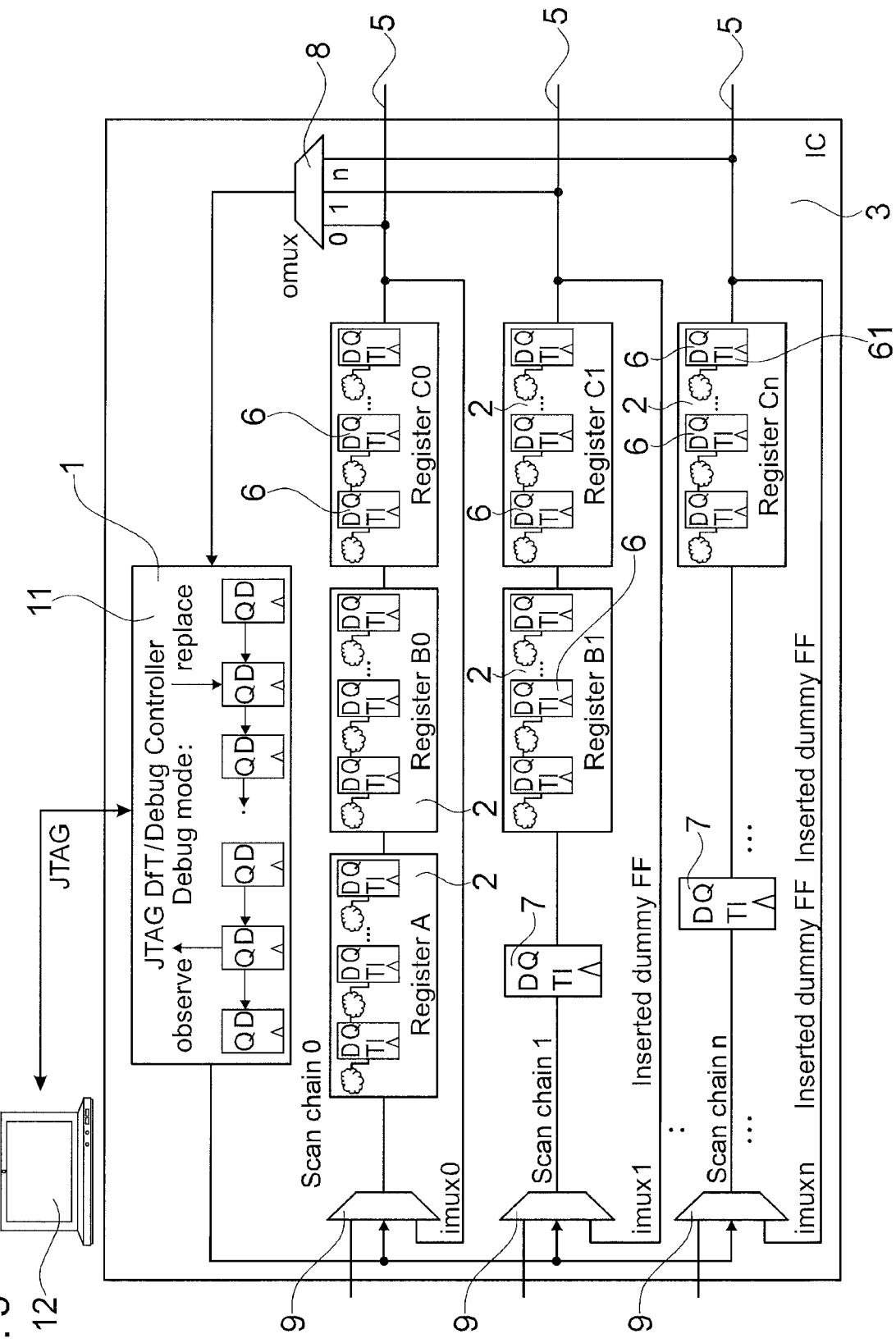

The appended drawings show
FIG. 1 A common joint test action group based infrastructure in an IC (state-of-the-art);
FIG. 2 Common design for testing structure in an IC (state-of-the-art);
FIG. 3 Inventive merged infrastructure for testing and debugging with the extended JTAG controller;
FIG. 4 Inserted feedback loop in a scan chain due to the inventive extended JTAG controller;
FIG. 5 Detailed schematic view of the inventive JTAG controller inside an IC.

DETAILED DESCRIPTION

FIG. 3 shows the inventive extended JTAG controller 1 wherein an external debugger 12 is connected to the design for testing scan infrastructure via the JTAG controller which is extended by a debug controller 11. The design for testing scan infrastructure is merged with the debug infrastructure in order to save gates of the IC 3 and simultaneously to make all registers 2 of the IC 3 accessible to the external debugger 12 and hence lower the power dissipation.

All internal registers 2 are accessible to the external debugger 12 without accessing the internal bus on the one hand and without increasing the power consumption on the other hand. If the internal bus is blocked or in a dead lock state, it does not matter, because all registers 2 can be read and written via the scan chains 5.

FIG. 4 shows the inserted feedback loop 10 in a scan chain 5. Module 2 represents a register which consist of n flip-flop. FIG. 4 shows two registers with n+m flip-flops connected to a scan chain. The loop back is necessary to preserve the content of all flip-flops of this scan chain. Each scan chain 5 has the same number of flip-flops 6. If this is not the case a dummy flip-flop 7 will be inserted to have the same number of flip-flops in each scan chain 5. The reason is, in debugging mode, that the not selected scan chains 5 shift back their content in the feedback loop 10 to retain it until these scan chains 5 are debugged as well. In debug mode, the content of the selected scan chain 5 will be shifted through the merged extended JTAG controller 1 and fed back. The content of the scan chain 5 can be observed or replaced in the controller.

FIG. 5 shows a detailed schematic view of the inventive JTAG controller 1 inside an IC 3. With the reuse of a common JTAG controller for design for testing tasks as well as for functional debugging it is possible to lower the power dissipation by reducing the number of gate counts in the IC 3.

The merged joint test action group (JTAG) design for testing/debug controller fulfils the requirement of the IEEE 1149.1 standard (boundary scan) and IEEE 1500 standard (core wrapper test).

So, the design for test (DfT) feature set is the same as for a standard DfT control. The debug feature set in design for test mode controls the input multiplexers (imux's), whereas the default value is to route through the scan chain input.

In debug mode the selected scan chain is connected to the controller which controls the output multiplexer (omux) multiplexing outputs of the connected scan chains and the according input multiplexer (imux) of the selected scan chain. The JTAG controller sets all other scan chains in loop back mode and controls the number of shift clock cycles.

For realizing the new extended JTAG controller and method for functional debugging using the extended JTAG controller new JTAG op codes for debug mode, input multiplexer control, output multiplexer control, shift value and shift control of the clock network and the observation and replacement of shift content is needed.

The advantage of the invention is that no additional hardware is needed to read and/or modify all registers. With this new methodology, all registers can be recorded, which is not possible with the state-of-the-art methodology. In the state-of-the-art, all registers that are eligible for debugging must be connected to an internal bus in order to be accessible by the debug controller. The invention relies on the existing design for test (DfT) structure and requires only additional OP codes for the combined JTAG/debug controller, the input and output multiplexers as well as the control logic for the multiplexers and clock cycles. This hardware cost is very low compared to the state-of-the-art methodology of making each register accessible by a bus.

REFERENCE SIGNS

1 extended joint action group (JTAG) controller
2 module, register
3 integrated circuit (IC)
4 design for testing infrastructure
5 scan chain
6 flip-flop
6l last flip-flop of a scan chain
7 dummy flip-flop
8 output multiplexer
9 input multiplexer
10 feedback loop, loop back
11 debug controller
12 external debugger

The invention claimed is:

1. A scan infrastructure on an integrated circuit (IC), the scan infrastructure, which is configured as a design for testing (DfT) scan infrastructure, comprising:
   at least one scan chain of a plurality of scan chains, the at least one scan chain having an output and an input and consisting of serial connected registers of the IC;
   a controller meeting an IEEE boundary scan standard; and
   a feedback loop, which is formed from the output of the at least one scan chain to an input multiplexer at the input of the at least one scan chain;
   wherein:
   an external debugger is connected to the controller,
   the controller is extended by a debug controller on the IC to provide an extended controller on the IC, and
   a selected scan chain of the plurality of scan chains is activated by the extended controller to access registers in said selected scan chain for testing flip-flops of the registers in said selected scan chain, in order to directly test functionality of the registers, making registers of the IC accessible to the external debugger via the extended controller of the DfT scan infrastructure.

2. The scan infrastructure according to claim 1, wherein all scan chains of the plurality of scan chains have a same number of flip-flops.

3. The scan infrastructure according to claim 2, wherein outputs of the scan chains of the plurality of scan chains are connected to an output multiplexer transmitting the outputs of the scan chains to the extended controller.

4. The scan infrastructure according to claim 1, wherein a dummy flip-flop is inserted in a particular scan chain of the plurality of scan chains, if the number of flip-flops in that particular scan chain of the plurality of scan chains is different from other scan chains.

5. The scan infrastructure according to claim 1, wherein the outputs of the scan chains of the plurality of scan chains are connected to an output multiplexer transmitting the outputs of the scan chains to the extended controller.

6. The scan infrastructure according to claim 5, wherein the external debugger observes flip-flops states of the IC and replaces the flip-flop states via the extended controller.

7. A method for functional debugging of registers of an IC using scan infrastructure, which comprises the extended controller according to claim 5, wherein in debugging mode
   the selected scan chain of the plurality of scan chains is connected to the extended controller,
   the selected scan chain of the plurality of scan chains is observed by the extended controller, the extended controller controls an output multiplexer multiplexing outputs of connected scan chains of the plurality of scan chains and a corresponding input multiplexer of the selected scan chain, wherein the extended controller controls a number of shift clock cycles, and the selected scan chain of the plurality of scan chains is modified by the extended controller, wherein the selected scan chain is fed back from the extended controller to the input multiplexer of the selected scan chain, while setting all other scan chains of the plurality of scan chains of the IC in a loop back mode.

8. The method for functional debugging of registers of an IC according to claim 7, wherein, in the loop back mode, flip-flops states are fed back to the input multiplexer of the selected scan chain of the plurality of scan chains, respectively.

9. The method for functional debugging of registers of an IC according to claim 8, wherein the extended controller switches to a next scan chain of the plurality of scan chains if an external debugger is accessing a scan chain of the plurality of scan chains.

10. The method for functional debugging of registers of an IC according to claim 9, wherein if the extended controller is in design test mode, the extended controller controls the input multiplexer, whereas a default value is routed through the scan chains.

11. The scan infrastructure according to claim 1, wherein the external debugger observes flip-flops states of the IC and replaces the flip-flop states via the extended controller.

12. The scan infrastructure according to claim 11, wherein the extended controller comprises an event trigger.

13. The scan infrastructure according to claim 1, wherein the extended controller comprises an event trigger.

14. The scan infrastructure according to claim 13, wherein a last flip-flop of a specified scan chain of the plurality of scan chains is designed as a hardware breakpoint.

15. The scan infrastructure according to claim 1, wherein a last flip-flop of a specified scan chain of the plurality of scan chains is designed as a hardware breakpoint.

16. A method for functional debugging of registers of an IC using the scan infrastructure, which comprises an extended controller according to claim 15, wherein in debugging mode the selected scan chain of the plurality of scan chains is connected to the extended controller, the selected scan chain of the plurality of scan chains is observed by the extended controller, the extended controller controls an output multiplexer multiplexing outputs of connected scan chains of the plurality of scan chains and a corresponding input multiplexer of the selected scan chain, wherein the extended controller controls a number of shift clock cycles, and the selected scan chain of the plurality of scan chains is modified by the extended controller, wherein the selected scan chain is fed back from the extended controller to the input multiplexer of the selected scan chain, while setting all other scan chains of the plurality of scan chains of the IC in a loop back mode.

17. A method for functional debugging of registers of an IC using a scan infrastructure, which comprises the extended controller according to claim 1, wherein in debugging mode the selected scan chain of the plurality of scan chains is connected to the extended controller, the selected scan chain of the plurality of scan chains is observed by the extended controller, the extended controller controls an output multiplexer multiplexing outputs of connected scan chains of the plurality of scan chains and a corresponding input multiplexer of the selected scan chain, wherein the extended controller controls a number of shift clock cycles, and the selected scan chain of the plurality of scan chains is modified by the extended controller, wherein the selected scan chain of the plurality of scan chains is fed back from the controller to the input multiplexer of the selected scan chain, while setting all other scan chains of the plurality of scan chains of the IC in a loop back mode.

18. The method for functional debugging of registers of an IC according to claim 17, wherein, in the loop back mode, flip-flops states are fed back to the input multiplexer of the selected scan chain of the plurality of scan chains, respectively.

19. The method for functional debugging of registers of an IC according to claim 17, wherein the extended controller switches to a next scan chain of the plurality of scan chains if the external debugger is accessing the next scan chain of the plurality of scan chains.

20. The method for functional debugging of registers of an IC according to claim 17, wherein if the extended controller is in design test mode, the extended controller controls the input multiplexer, whereas a default value is routed through the scan chains.

* * * * *